United States Patent [19]

Avins

[11] 4,328,463
[45] May 4, 1982

[54] ENCODER FOR RECORDING INCREMENTAL CHANGES

[75] Inventor: Jeremiah Y. Avins, Kendall Park, N.J.

[73] Assignee: RCA Corporation, New York, N.Y.

[21] Appl. No.: 134,348

[22] Filed: Mar. 27, 1980

[51] Int. Cl.³ .............................................. H03K 5/22
[52] U.S. Cl. .................................... 328/133; 307/514; 250/231 SE; 340/347 M; 340/347 P
[58] Field of Search ................. 307/232; 250/231 SE, 250/237 G; 340/347 P; 328/133

[56] References Cited

U.S. PATENT DOCUMENTS

| | | | |
|---|---|---|---|
| 4,079,251 | 3/1978 | Osann, Jr. | 250/231 SE |
| 4,094,371 | 6/1978 | Ferrell | 177/210 R |
| 4,246,497 | 1/1981 | Lawson et al. | 307/232 |

OTHER PUBLICATIONS

Hancock, Bi-Directional Count from Quadrature Signals, Electronic Engineering, 5/1978, p. 24.

*Primary Examiner*—Thomas J. Sloyan
*Attorney, Agent, or Firm*—Samuel Cohen; Robert L. Troike; Donald W. Phillion

[57] ABSTRACT

A circuit for detecting leading or lagging phase relationship between first and second two-level input signals at each level transition of both of said input signals and comprising first and second voltage comparators each having first and second input terminals and a single output terminal and each responsive to signals of equal and non-equal logic levels supplied to the first and second input terminals thereof to produce an output signal having high and low logic levels, respectively. First and second input signals are supplied to the first input terminals of the first and second voltage comparators, respectively. A pulse generator responds to each level transition of said first input signal to produce a clock pulse. A decoder responds to the output signals of the first and second voltage comparator to determine the phase relationship of the first and second input signals at each level transition of both input signals and to generate and supply to the second input terminals of the first and second voltage comparators, after each level transition of the second input signal, an acknowledgement signal which prepares the circuit for the reception of the next two level transitions of said input signals.

6 Claims, 4 Drawing Figures

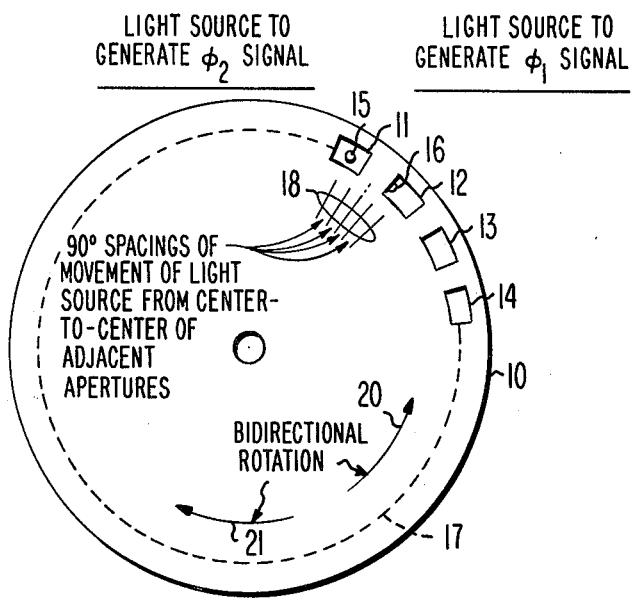
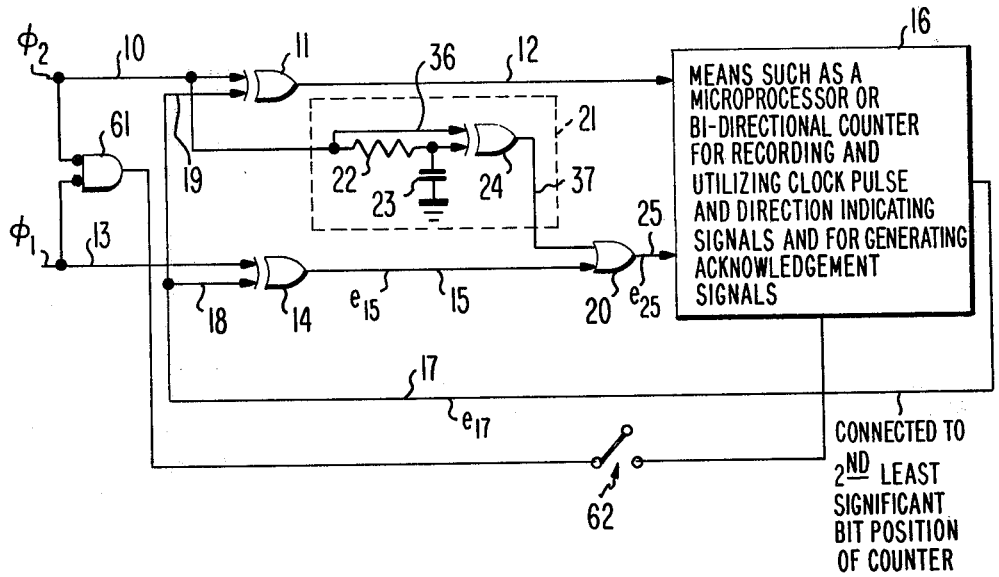

ENCODER FOR RECORDING INCREMENTAL CHANGES

This invention relates generally to incremental encoders of the type employed to track the position of a moving object, such as a bi-directionally rotatable disc, and more particularly, to a circuit for determining the phase relationship of a pair of two-level signals of equal frequency produced by said moving object, upon the occurrence of each level transition of both of said signals.

Prior art systems have been devised which detect the leading or lagging phase relationship of the two signals at the time of each level transition of both of the two input signals. These prior art devices accomplish their result, in effect, by dividing the two signals into four quadrants for each complete cycle of operation. More specifically, the logic levels of the two signals will have four relationships, e.g., when they are both high, when they are both low, and when one is high and the other is low. Such prior art devices further contain logic which remembers at least the two immediately prior permutations of logic levels in addition to the one in which a determination of the phase relationship of the two signals at a level transition is to be made. Prior art devices of this type are complex and require a relatively large amount of logic in order to remember the two prior level states as well as the state in which the decision is to be made, and then to decide from such information the proper interpretation of the level transition in the state being considered. Such complex logic is expensive and therefore prohibitive in many applications. Further, because of the complexity, the time required for the circuit to make a decision is greater than would be required for a system having fewer components, and therefore functions more slowly to further limit the number of feasible applications.

A recent development in the incremental encoder art is described in co-pending application Ser. No. 103,443, filed Dec. 14, 1979 by Jeremiah Yehudi Avins and entitled "Incremental Encoder." In this co-pending application, filed on Dec. 14, 1979, the structure includes at least two Exclusive OR gates, two flip-flop circuits, and an up/down counter means or equivalent thereof, all of which cooperate to maintain a correct direction or phase relationship-indicating signal at each transition of two two-level input signals so that each transition thereof will be recorded as occurring either during a leading or a lagging phase relationship of the two input signals.

In accordance with a preferred form of the invention there is provided first and second voltage comparing means each having first and second input terminal means and a single output terminal means and each responsive to signals of equal and non-equal levels supplied to said first and second input terminal means to produce an output signal having high and low logic levels, respectively, and means for supplying first and second received input signals to the first input terminal means of said first and second voltage comparing means, respectively. Pulse generating means are provided to respond to each transition of said first of said two input signals to produce a clock pulse. Also provided are decoding means responsive to the output signals of said first and second voltage comparing means and to said pulse generating means to determine the phase relationship of said first and second input signals at each level transition of both of said input signals, and means for generating and supplying to said second input terminal means of said first and second voltage comparing means, after each level transition of said second input signal only, a signal whose level is the same as the level of said second input signal.

In the drawings:

FIG. 1 shows a prior art rotatable disc with apertures positioned around the perimeter thereof for generating first and second direction indicating two-level signals with leading or lagging phase relationship;

FIG. 2 is a combined function and logic diagram of a preferred form of the invention;

Figure 3:
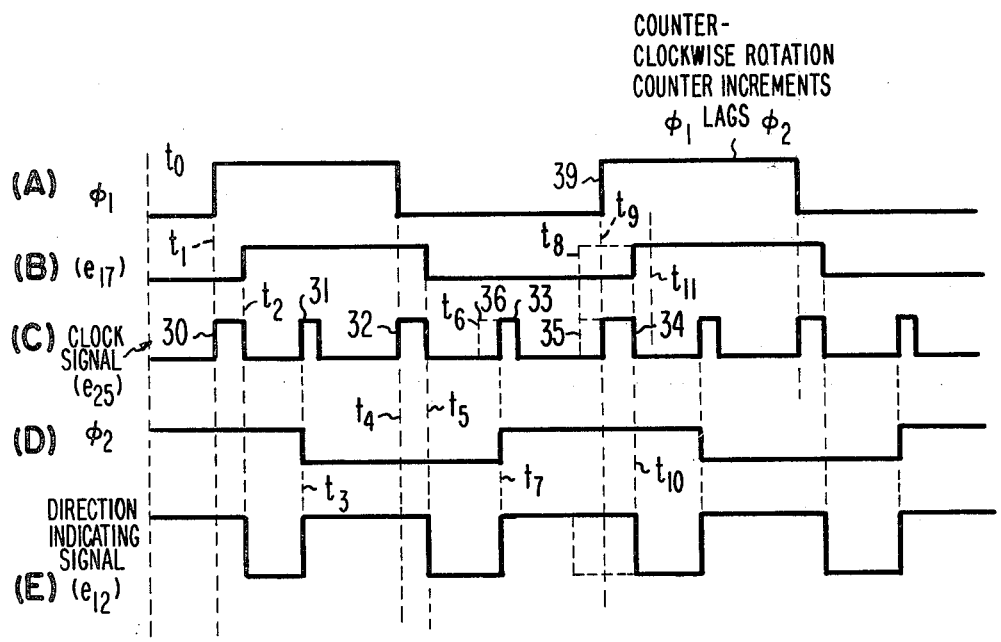
FIG. 3 is a first set of waveforms showing the voltage of various points in the diagram of FIG. 2 during a first mode of operation thereof.

Referring now to FIG. 1 there is shown a prior art means for generating a pair of two-level signals which have either a leading or lagging phase relationship. The disc 10 has a circular row of apertures 17 formed around the perimeter thereof, such as the individual apertures 11, 12, 13 and 14. A pair of light sources 15 and 16 are positioned adjacent the apertures to project a beam of light through said apertures to photo-electric devices (not shown) as the disc 10 is rotated. The two light sources 15 and 16 are positioned in such a manner that one of the light sources 15 will be centered in an aperture, such as aperture 11, at the time the other light source 16 is just crossing the edge of another aperture 12 and into said aperture 12. Thus, if the disc 10 is rotating in the counter-clockwise direction, as indicated by arrow 20, the signal $\phi_2$ produced by a beam of light from light source 15 through aperture 11 will lead the phase of the signal $\phi_1$ produced by a beam of light from light source 16 through aperture 12 to produce the signals $\phi_1$ and $\phi_2$ shown in waveforms A and D of FIG. 3.

Specifically, signal $\phi_1$, shown as waveform A of FIG. 3, is produced by light from light source 16 of FIG. 1 impinging on a photoelectric device through an aperture 17 and signal $\phi_2$, shown in waveform D of FIG. 3, is produced by light from light source 15 of FIG. 1 impinging on a photoelectric device through an aperture 17. It is to be noted that while signals $\phi_1$ and $\phi_2$ are shown as being in phase quadrature it is not necessary that they be so. It is only necessary that there be a leading or lagging phase relationship.

Figure 4:
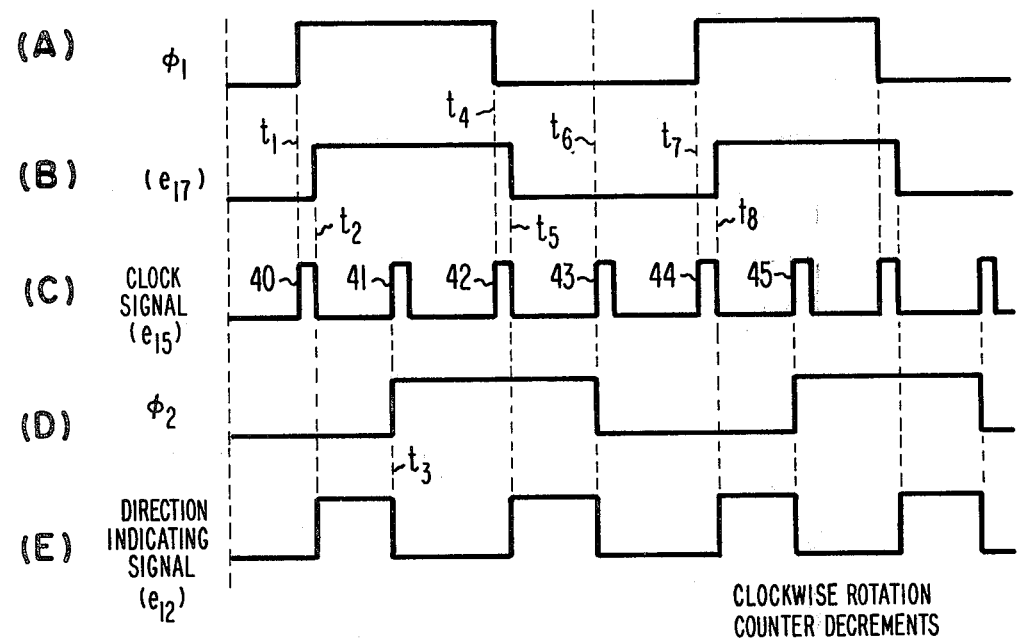
FIG. 4 is a set of waveforms showing the voltage at various points in the diagram of FIG. 2 during a second mode of operation thereof.

When the rotation of disc 10 is reversed to rotate in the direction of arrow 21 (clockwise), the phase of the signal $\phi_1$ produced by light source 16 will lead the phase of the signal $\phi_2$ produced by light source 15, as shown in waveforms A and D of FIG. 4.

Before discussing the details of the invention, it should be noted that the waveforms of FIG. 3 will be identified herein as waveforms 3A, 3B, 3C, 3D, and 3E and the waveforms of FIG. 4 as waveforms 4A, 4B, 4C, 4D, and 4E. Further, the voltages represented by the waveforms of FIGS. 3 and 4 will be identified by the letter "e" with the subscript corresponding to the lead in FIG. 2 having the corresponding reference character. Thus, for example the acknowledgment signal on lead 17 as $e_{17}$, the clock signal on lead 25 as $e_{25}$, and the direction indicating signal appearing on lead 12 as $e_{12}$.

Referring now to FIG. 2 the Exclusive OR gates 11, 14 and 24 are conventional logic elements and each having the characteristic that when the two signals supplied to their two input terminals are of equal logic levels, their output signal is a low level signal and when the two input signals are of unequal levels their output signal is a high level signal. As will be discussed in detail later herein such characteristic is employed to generate clock pulses at the outputs of Exclusive OR gates 14 and 24 which are supplied to clock input lead 25 of decoder means 16 through OR gate 20, and also to generate a direction or phase relationship indicating signal (of input signals $\phi_1$ and $\phi_2$) at the output of Exclusive OR gate 11 which is supplied to input lead 12 of decoding means 16.

The circuit within the dotted block 21, which includes Exclusive OR gate 24, resistor 22, and capacitor 23, will detect and translate every level transition of signal $\phi_2$, whether from a high to a low level or from a low to a high level, into a positive clock pulse which is supplied through OR gate 20 to the clock input lead 25 of decoding means 16. Decoding means 16 is essentially a logic means which receives and records the clock pulses received from OR gate 20 in accordance with the direction indicating signal received from Exclusive OR gate 11.

In a broad generalization of the operation of the circuit of FIG. 2, the two input signals $\phi_1$ and $\phi_2$ are supplied respectively to first input terminals 13 and 10 of Exclusive OR gates 14 and 11. The output signals from the Exclusive OR gates 14 and 11, which are, respectively, clock pulse signals $e_{25}$ and the direction indicating signal $e_{12}$, are then supplied respectively to the clock input lead 25 of decoding means 16 through OR gate 20 and the direction indicating signal input terminal 12 of decoding means 16.

In response to the clock signals generated by Exclusive OR gate 14, the decoding means 16 generates a two-level acknowledgment signal $e_{17}$ on lead 17 acknowledging the receipt and the decoding of such clock signals in accordance with the level of the concurrent direction indicating signal appearing on lead 12. Such acknowledgment signal is supplied back to the second input terminals 18 and 19 of Exclusive OR gates 14 and 11 via lead 17.

As mentioned briefly above the circuit within the dotted block 21 can be any one of several circuits which detects and translates every level change of signal $\phi_2$, whether from high to low or from low to high, into a positive pulse which is then supplied through OR gate 20 to decoding means 16. The circuit 21 and the Exclusive OR gate 20 must have a sufficiently large inherent time delay so that the clock pulse generated in circuit 21 and supplied to the decoder means 16 occurs after the change in the direction determining signal $e_{12}$ resulting from the same level transition of signal $\phi_2$.

The particular circuit 21 shown in FIG. 2 operates in the following manner. Each level transition of signal $\phi_2$, whether from a high to low or from low to high, will charge capacitor 23 through resistor 22 either negatively or positively to follow the polarity change of signal $\phi_2$. The charging of capacitor 23 takes a finite time so that for such finite time the signal levels supplied to the two input terminals of Exclusive OR gate 24 will be different. The change in level of signal $\phi_2$ is also supplied, without delay, directly to the input terminal 36 of Exclusive OR gate 24. Thus, during the aforementioned finite period of time when the signal levels supplied to the two inputs of Exclusive OR gate 24 are unequal, a positive pulse will be generated at the output terminal 37 of Exclusive OR gate 24 and will be supplied through OR gate 20 to the input of decoder means 16 where it will be interpreted, as discussed above, in accordance with the concurrent polarity of the direction indicating signal $e_{12}$. When capacitor 23 becomes charged to the new level of $\phi_2$ the output of Exclusive OR gate 24 will change to its low level, thus, in effect, terminating pulse 35.

It is to be noted generally at this time and from an examination of the waveforms of FIGS. 3B, 3C, and 3E that the generation of clock pulses resulting from level transitions of signal $\phi_2$ will not produce, nor should they produce, a change in level of the acknowledgment signal $e_{17}$ (waveform 3B). In fact, it is necessary that the acknowledgment signal level not be changed when signal $\phi_2$ changes since a change in the level of the acknowledgment signal would produce a change in level of the direction indicating signal $e_{12}$ and no such change is wanted, the proper direction indicating signal already having been produced by the level transitions of signal $\phi_1$, as will be discussed later herein. Further, no acknowledgment signal is necessary to terminate the clock pulse 35 which, as discussed above, is self-terminating.

Changes in the level of the acknowledgment signal $e_{17}$ occur only with level changes of signal $\phi_1$. Such pattern of level changing of the acknowledgment signal $e_{17}$ can be obtained, for example, by deriving the acknowledgment signal from the contents of the second least significant bit position of a bi-directional counter which can be included in decoder 16. The contents of such second least significant bit position will change only in response to every alternate clock pulse received by the bi-directional counter, as will be discussed in more detail later herein.

In the operation of the system, assume that the initial operating conditions are shown at time $t_0$ in FIG. 3, where signals $\phi_1$ and $e_{17}$, are at their low levels and signal $\phi_1$ and the direction indicating signal $e_{12}$ are at their high levels. There is no clock signal present at time $t_0$.

The direction indicating signal $e_{12}$ is at its high level since the voltage levels ($\phi_2$ and $e_{17}$) appearing on the two input terminals of Exclusive OR gate 11 are unequal. As discussed above, it is a characteristic of an Exclusive OR gate that when the two signals supplied to the two input terminals thereof are of equal levels, the output is at a low level and when the two input signals supplied thereto are unequal the output of the Exclusive OR gate is at a high level. Accordingly, at time $t_0$ the output of Exclusive OR gate 14 is at a low level since both signal $\phi_1$ and the acknowledgment signal $e_{17}$ are at low levels as shown in waveforms 3A and 3B.

At time $t_1$, signal $\phi_1$ changes from its low to its high level, as shown in waveform 3A, to cause the two input signals to Exclusive OR gate 14 to be unequal so that the output thereof, and also that of OR gate 20 on lead 25, rises to a high level, as shown in waveform 3C. The transition of the output signal of Exclusive OR gate 14 from its low to its high level constitutes a clock signal 30 which is received by the logic within block 16. Such logic 16 records the change of level of $\phi_1$ as occurring when the phase relationship of signals $\phi_1$ and $\phi_2$ is as indicated by the polarity of the direction indicating signal $e_{12}$. Referring to the disc 10 structure of FIG. 1 as an example, a positive direction indicating signal indicates the condition of signal $\phi_1$ lagging signal $\phi_2$, which condition is produced by a counter-clockwise rotation of the disc. A clockwise rotation of disc 10 is indicated by a negative direction indicating signal. The polarity of the direction indicating signal with respect to counter-clockwise or clockwise rotation of the disc 10 is determined by the positions of the light sources 15 and 16 with respect to the disc apertures.

Each clock signal supplied to logic means 16, which, as stated above can comprise a bi-directional counter, will cause such counter to either increment or to decrement by a count of one in accordance with the polarity of the direction indicating signal $e_{12}$ on lead 12, thereby indicating the direction of rotation of the disc 10 of FIG. 1 and also the angular amount of such rotation, such angular motion being determined by the spacing between the apertures on the perimeter of disc 10. The counter is arbitrarily constructed to increment by one during each transition of signal $\phi_1$ when the disc is rotating in a counter-clockwise direction and to decrement by one during each transition of $\phi_1$ when the disc is rotating in a clockwise direction.

Decoding means 16 is constructed to generate an acknowledgment signal which, when the decoding means 16 is a bi-directional counter, can be the output of the second least significant bit position of said counter. As discussed above, the contents of the second least significant bit position of the counter is employed as the acknowledgment signal since it is desired that only the transitions of $\phi_1$ will change the level of the acknowledgment signal and not the transitions of $\phi_2$ for reasons that will be discussed in detail later herein.

Assume that at time $t_0$ said second least significant bit position of the bi-directional counter contained a binary 0 which subsequently changes to a binary 1 as a result of the clock pulse 30 occurring at time $t_1$. Assume further that at time $t_0$ the least significant bit position of the counter contained a binary 1, thereby causing the contents of the second least significant bit position to change to a binary 1 upon the occurrence of clock pulse 30.

The changing to a binary 1 of the contents of the second least significant bit position of the counter in logic means 16 results in a high level acknowledgment signal (waveform 3B) being supplied back via lead 17 at time $t_2$ to the inputs of Exclusive OR gates 11 and 14. Such high level signal will produce two results. Firstly, the output of Exclusive OR gate 14 ($e_{15}$) will return to its low level since the signal levels supplied to its two inputs are now equal. Such signal levels were unequal between times $t_1$ and $t_2$. Secondly, the direction indicating signal $e_{12}$ (waveform 3E) appearing on the output of Exclusive OR gate 11 will change from its high to its low level at time $t_2$ since the positive acknowledgment signal on lead 17 will be the same level as signal $\phi_2$ at time $t_2$.

The low level condition of the direction indicating signal of waveform 3E at time $t_2$ is incorrect if the disc 10 of FIG. 1 continues its counter-clockwise rotation. As defined above, a high level direction indicating signal is required for a counter-clockwise rotation. However, at time $t_3$ in waveform 3D, signal $\phi_2$ changes from its high to its low level. This causes the two input signal levels supplied to Exclusive OR gate 11 to become unequal with the output of Exclusive OR gate 11 changing from its low to its high level, the correct level to indicate counter-clockwise rotation.

Concurrently with signal $\phi_2$ changing from its high to its low level at time $t_3$ the circuit 21 will respond thereto to generate a clock pulse 31 which will be supplied through OR gate 20 to increment bi-directional counter 16 by one, thereby changing the contents of the least significant bit position to a binary 1 but not changing the contents of the second least significant bit position, which remains a binary 1. Such clock signal 31 is supplied to counter 16 after the directional signal $e_{12}$ has changed to its high level, thereby indicating angular motion in the counter-clockwise direction.

Further, at time $t_4$ when signal $\phi_1$ again changes from its high to its low level the direction indicating signal $e_{12}$ on lead 12, shown in waveform 3E, will be of the proper high level to indicate the counter-clockwise direction of rotation of disc 10 of FIG. 1. Worded differently, the high level of the direction indicating signal $e_{12}$ of waveform 3E indicates that the phase of signal $\phi_1$ is lagging the phase of signal $\phi_2$ at the transition of signal $\phi_1$ from its high to its low level at time $t_4$.

The transition of signal $\phi_1$ from its high to its low level at time $t_4$ also generates another clock pulse 32 at the output terminal 15 of Exclusive OR gate 14. Such clock pulse 32 is supplied to decoding logic 16 which in turn changes the level of the acknowledgment signal $e_{17}$ on lead 17 to a low level. Such acknowledgment signal is supplied back to the input terminals of Exclusive OR gates 11 and 14 at time $t_5$ to effect two results. The first result is that the clock pulse 32 on the output of Exclusive OR gate 14 is terminated since the signal levels supplied to the two inputs of Exclusive OR gate 14 now become equal and the output of Exclusive OR gate 14 changes back to its low level, as shown at time $t_5$ in waveform 3C.

The second result of the acknowledgment signal $e_{17}$ is that the signal level supplied to the two inputs of Exclusive OR gate 11 also become equal at time $t_5$ so that the direction indicating output signal $e_{12}$ thereof changes from its high to its low level, as shown in waveform 3E at time $t_5$.

Next, at time $t_7$, signal $\phi_2$ changes from its low to its high level to change the level of the direction indicating signal $e_{12}$ at the output of Exclusive OR gate 11 from its low to its high level in preparation for the next clock pulse 33 generated by circuit 21 at time $t_7$ and the next phase transition of signal $\phi_1$ at time $t_9$. At time $t_9$, signal $\phi_1$ changes from its low to its high level to initiate the generation of clock pulse 34 at the output of Exclusive OR gate 14, which pulse is supplied to decoding means 16 in the manner described hereinbefore. Decoding means 16 subsequently at time $t_{10}$ changes the level of the acknowledgment signal $e_{17}$ to its high level which is supplied back to the inputs 18 and 19 of Exclusive OR gates 11 and 14 via lead 17 to terminate clock pulse 34 at time $t_{10}$ and also to change the level of the direction indicating signal at the output of Exclusive OR gate 11 from its high to its low level, as shown in waveform 3E, also at time $t_{10}$.

The description of a complete cycle of operation extending from a first low-to-high level transition $\phi_1$ at time $t_1$ to a second low-to-high level transition of $\phi_1$ at time $t_9$ has now been completed.

It is to be understood that the width of the clock pulses 30–34 in relation to the period of the other signals $\phi_1$ and $\phi_2$ are shown disproportionately large in the drawings. More specifically, the clock pulses 30–34 can have a width of less than a microsecond, whereas the periods of signals $\phi_1$ and $\phi_2$ can be of the order of hundreds of microseconds or even milliseconds, depending upon the angular velocity of the disc of FIG. 1, or the frequency of change of other devices employed with the invention. For example, when employed with means for measuring the direction of the fringes produced by an interferometer the periods of signal $\phi_1$ and $\phi_2$ will be much shorter than when measuring the rotation of a disc 10 such as shown in FIG. 1.

After the level transition of $\phi_1$ at time $t_9$, and the resulting clock pulse 34 occurring at time $t_{10}$, it is possible that the disc 10 of FIG. 1 will stop at some time $t_{11}$ and then oscillate back and forth across the level transition 39 of $\phi_1$ at time $t_9$.

A clockwise motion of the disc 10 of FIG. 1 requires that the bi-directional counter 16 decrement one count indicating the clockwise rotation of the disc. The foregoing is effected in the following manner. As the disc rotates in a clockwise direction, it will cross the level transition 39 of $\phi_1$ at time $t_9$ before a clock pulse 35 is generated at the output of Exclusive OR gate 14 at time $t_9$. However, the level of the direction indicating signal $e_{12}$ on the output lead 12 of Exclusive OR gate 11 remains at its low level until time $t_8$, since a change in level thereof cannot occur until after the generation of clock pulse 35 and the resulting level change of the akcnowledgment signal. Such acknowledgment signal level change is received at the inputs of Exclusive OR gates 11 and 14 at time $t_8$, as shown in waveform 3B, to terminate the clock pulse 35 at the output of Exclusive OR gate 14 and also to change the direction indicating signal $e_{12}$ on the output of Exclusive OR gate 11 from its low to its high level, thereby preparing the system for another level transition of $\phi_1$ at time $t_9$ should the disc 10 (FIG. 2) oscillate back to its original counter-clockwise direction and again produce the level transition 39.

On the other hand, should the disc continue to rotate in a clockwise direction, it will produce a high-to-low level transition of signal $\phi_2$ at time $t_7$, thereby causing the direction indicating signal $e_{12}$ to go to its low level at time $t_7$ to initiate the generation of another clock pulse in circuit 21 and for another level transition of $\phi_1$ at time $t_4$ should the disc continue to rotate in a clockwise direction. It is to be understood that when the disc is rotating in a clockwise direction the time $t_9$ occurs after time $t_{10}$, time $t_8$ occurs after time $t_9$, time $t_7$ occurs after time $t_8$, etc.

A more detailed discussion of the operation of the structure of FIG. 2 when the phase of $\phi_1$ leads that of $\phi_2$ will now be set forth with reference to the waveforms of FIG. 4. Assume that the initial operating conditions are shown at time $t_0$ when both $\phi_1$ and $\phi_2$ are at their low levels and the direction indicating signal $e_{12}$ is also at its low level, indicating a clockwise direction of rotation of the disc 10 of FIG. 1.

At time $t_1$ signal $\phi_1$ changes from its low to its high level as shown in waveform 4A to generate a clock pulse 40 (waveform 3C) on the output terminal 15 of Exclusive OR gate 14. The direction indicating signal $e_{12}$ is at its low level at this time so that the clock pulse 40 is interpreted by decoding means 16 to indicate that the disc has rotated one angular increment in a clockwise direction.

At time $t_2$, the acknowledgment signal $e_{17}$ which is supplied from decoding means 16 via lead 17 to the two inputs of Exclusive OR gates 11 and 14 changes to its high level to effect two results. The first result is a termination of the clock signal 40 at time $t_2$ since the two inputs to Exclusive OR gate 14 are now at equal (high) levels and the second result is to change the direction indicating signal from its low level to its high level since the signal levels of the two signals supplied to the two inputs of Exclusive OR gate 11 are now unequal. Next, at time $t_3$, signal $\phi_2$ changes from its low to its high level to change the direction indicating signal $e_{12}$ to its low level (indicating the proper clockwise direction of rotation of disc 10 of FIG. 1) and causing circuit 21 to generate clock pulse 41. Clock pulse 41 is supplied to decoder means 16 which responds thereto to record the clockwise rotation of disc 10 but does not change the level of the acknowledgment signal $e_{17}$, as discussed above.

When the next transition of signal $\phi_1$ occurs at time $t_4$ a clock pulse 42 will be generated on the output terminal 15 of Exclusive OR gate 14 and will be received by decoding means 16. Since the direction indicating signal is at its low level at time $t_4$, the clock signal 42 will be interpreted as an increment of angular movement of the disc in a clockwise direction which is in fact the direction the disc is rotating.

Following the clock pulse 42, the acknowledgment signal $e_{17}$ will be changed to its high level by decoding means 16 at time $t_5$ and supplied through lead 17 to the inputs of the two Exclusive OR gates 11 and 14 to terminate the clock pulse 42 on lead 15 and to change the level of the direction indicating signal $e_{12}$ on output 12 of Exclusive OR gate 11 to its high level.

Next, at time $t_6$, the signal $\phi_2$ changes from its high to its low level thereby changing the level of the direction indicating signal $e_{12}$ on the output terminal 12 of Exclusive OR gate 11 to its low level in preparation for the next clock pulse 43 (waveform 4C) generated by circuit 21 at time $t_6$ as a result of the level change of signal $\phi_2$, and for the next level change of signal $\phi_1$ at time $t_7$. The clock pulse 43 is supplied through OR gate 20 of FIG. 2 to decoder 16 which records the increment of rotation but does not change the level of the acknowledgment signal. The low-to-high level transition of signal $\phi_1$ occurring at time $t_7$ produces a clock pulse 44 on the output terminal 15 of Exclusive OR gate 14 which is supplied to decoding means 16 through OR gate 20. Subsequently at time $t_8$, the usual change in the level of the acknowledgment signal occurs by means of decoding means 16 and is supplied to Exclusive OR gates 11 and 14 to terminate the clock pulse 44 at time $t_8$ and to change the direction indicating signal $e_{12}$ of waveform 4E to its high level.

When a bi-directional counter is employed in the decoder logic 16 it is necessary that the contents of the least significant bit position and the next to least significant bit position thereof be synchronized with the phases of the incoming signals $\phi_1$ and $\phi_2$ so that changes in the contents of the next to least significant bit positions occur only at level transitions of $\phi_1$ and not at level transitions of $\phi_2$. The foregoing can be accomplished in the following manner with reference to FIG. 4.

Such synchronization can be obtained by setting the least significant and the next to least significant bits to binary 0 when both signals $\phi_1$ and $\phi_2$ are at their low levels, as shown during the times $t_6$–$t_7$ of FIG. 4, which shows the characteristics of the system when the disc is rotating in a clockwise direction with the counter decrementing. Thus, at the next transition of $\phi_1$ at time $t_2$ the counter will decrement from 00 to 11 (the last bit being the least significant), thereby correctly causing a change in the next to least significant bit position of the counter.

On the other hand, if the disc should rotate in a counter-clockwise direction, that is, to the left in FIG. 4, the next level transition would be that of signal $\phi_2$ at time $t_6$. As discussed above, the direction indicating signal would change from its low level to its high level before the clock pulse would be generated by the level transition of signal $\phi_2$. Therefore, such clock pulse would cause an incrementing of the counter so that the two least significant bit positions would change from 00 to 01 with the contents of the next to least significant bit position remaining unchanged. Should the disc continue to rotate in a counter-clockwise direction, the next transition will be that of signal $\phi_1$ at time $t_4$ which will increment the counter again by 1 to change the contents of the two least significant bit positions from a 01 to a 10. Thus, the contents of the next to least significant bit position has correctly changed at the level transition of signal $\phi_1$.

One means to implement such initial synchronization of the contents of the two least significant bit positions with the phases of signals $\phi_1$ and $\phi_2$ is shown in FIG. 2. Specifically, signals $\phi_1$ and $\phi_2$ are supplied to the inputs of NAND gate 61, the output of which is supplied through switch 62 to reset the two least significant bit positions of the bi-directional counter in logic means 66 to 0. When both signals $\phi_1$ and $\phi_2$ are at their low levels, switch 62, which can be an electronic switch, can be closed for a few cycles at the beginning of operation of the circuit to produce the desired synchronization and can then be opened. A microprocessor as logic 16 can be easily programmed to perform the synchronization function.

I claim:

1. A circuit for detecting leading or lagging phase relationship between first and second two level input signals at each level transition of said first and second signals and comprising:
    first and second voltage comparing means each having first and second input terminal means and output terminal means and each responsive to signals of equal and non-equal levels supplied to the first and second input terminal means thereof to produce an output signal having high and low levels, respectively;
    first means for supplying said first and second input signals to the first input terminal means of said first and second voltage comparing means, respectively;
    second means responsive to said first input signal to produce an output pulse of a given polarity level at each level transition of said first input signal;
    logic means responsive to the output signals of said first and second voltage comparing means and to the output pulses from said second means to determine the phase relationship of said first and second input signals at each level transition of said first and second input signals; and
    said logic means including acknowledgment signal generating means for generating and supplying to said second input terminal means of said first and second voltage comparing means, in response to each determination of phase relationship and in response to each level transition of said second input signal only an acknowledgment signal whose level is equal to the level of said second input signal and whose duration remains until after the next level transition of said second input signal occurs and the next level of the acknowledgment signal begins.

2. A circuit as in claim 1 in which:
    said logic means comprises a bi-directional counting means having a least significant bit position and a next to least significant bit position and responsive to each level transition of said first and second input signals to count up or down at each level transition of said first and second input signals in accordance with the high or low level state of said output signal of said first voltage comparing means; and
    in which said acknowledgment signal generating means comprises means for supplying the contents of the next to least significant bit position of said bi-directional counting means to said second input terminal means of said first and second voltage comparators means;
    and in which said acknowledgment signal generating means comprises synchronizing means for initially synchronizing the contents of said least significant bit and said next to least significant bit so both have the same signal level at a given time during at least the first cycle of said first and second input signals.

3. A circuit as in claim 1 in which:
    said logic means and said first means comprise data processing means responsive to the output signals from said first and second voltage comparing means and the level transitions of said first input signal to record each level transition of said first and second input signals and the concurrent high or low level state of said output signal of said first voltage comparing means, and to generate said acknowledgment signal.

4. A circuit for detecting leading or lagging phase relationship between first and second two level input signals at each level transition of said first and second input signals and comprising:
    first and second Exclusive OR gate means each having first and second input terminal means and an output terminal means;
    first means for supplying said first and second input signals to the first input terminal means of said first and second Exclusive OR gate means, respectively;
    second means responsive to said first input signal to produce an output pulse of a given polarity level at each level transition of said first input signal;
    logic means responsive to the output signals of said first and second Exclusive OR gate means and said second means to determine the leading or lagging phase relationship of said first and second input signals at each level transition of said first and second input signals; and
    said logic means including acknowledgment signal generating means responsive only to each level transition of said second input signal for generating and supplying to said second input terminal means of said first and second Exclusive OR gate means an acknowledgment signal whose level is equal to the level of said second input signal and whose duration continues until after the termination of the next level transition of said second input signal and the beginning of the next level of the acknowledgment signal.

5. A circuit as in claim 4 in which:
    said logic means comprises a bi-directional counting means having a least significant bit position and a next to least significant bit position and responsive to each level transition of said first and second input signals to count up or down at each level transition of said first and second input signals in accordance with the high or low level state of said output signal of said first Exclusive OR gate means;

in which said acknowledgment signal generating means comprises means for supplying the contents of the said next to least significant bit position of said bi-directional counting means to said second input terminal means of said first and second Exclusive OR gate means;

and in which said acknowledgment signal generating means for generating and supplying said acknowledgment signal further comprises synchronizing means for initially synchronizing the contents of said least significant bit and said next to least significant bit so both have the same signal level at a given time during at least the first cycle of said first and second signals.

6. A circuit as in claim 4 in which:

said logic means and said third means comprise data processing means responsive to the output signals from said first and second Exclusive OR gate means and the level transitions of said first input signal to record each level transition of said first and second input signals and the concurrent high or low level state of said output signal of said first Exclusive OR gate means; and to generate said acknowledgment signal.

* * * * *